(12) United States Patent
Das

(10) Patent No.: US 8,217,816 B2
(45) Date of Patent: Jul. 10, 2012

(54) SIGMA-DELTA MODULATOR

(75) Inventor: Abhijit Kumar Das, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 30 days.

(21) Appl. No.: 12/906,798

(22) Filed: Oct. 18, 2010

(65) Prior Publication Data

US 2012/0092200 A1    Apr. 19, 2012

(51) Int. Cl.
*H03M 3/00* (2006.01)
(52) U.S. Cl. ........................... 341/143; 341/139
(58) Field of Classification Search ............ 341/143, 341/139
See application file for complete search history.

(56) References Cited

U.S. PATENT DOCUMENTS

| 6,278,750 | B1 * | 8/2001 | Yu ................................. 375/345 |
| 6,331,834 | B1 * | 12/2001 | Smith ............................ 341/155 |
| 6,795,005 | B2 | 9/2004 | Hochschild |
| 6,940,438 | B2 | 9/2005 | Koe et al. |
| 2009/0135038 | A1 | 5/2009 | Das |

* cited by examiner

*Primary Examiner* — Khai M Nguyen
(74) *Attorney, Agent, or Firm* — Alan A. R. Cooper; Wade James Brady, III; Frederick J. Telecky, Jr.

(57) ABSTRACT

A Sigma-Delta Modulator (SDM) has a summing junction that receives an input signal and a feedback signal, a multi-level analog-to-digital converter (ADC) that receives the SDM input signal and generates an ADC output, a first analog switch that receives the ADC output and generates a plurality of reference voltages, a second analog switch generating the feedback signal, where the feedback signal is selected from one of the reference voltages.

14 Claims, 2 Drawing Sheets

SIGMA-DELTA MODULATOR

DESCRIPTION OF THE RELATED ART

Electronic pulse modulator circuits convert an analog signal to a sequence of pulses suitable for transmission over a digital transmission system. For some types of pulse modulators, the number of output pulses per unit time represents the magnitude of the analog input.

One common pulse modulator design is the sigma-delta modulator (also known as delta-sigma modulator, or SDM, or DSM). FIG. 1A illustrates a simplified basic SDM 100. SDM 100 receives an analog input signal 102, generates a digital output signal 104 (which is binary in the example of FIG. 1A), and generates a feedback signal 106. A summing junction 108 combines the input signal and the feedback signal 106. The feedback signal is inverted, so the summing junction effectively subtracts the feedback signal 106 from the input signal 102, generating an error signal. An integrator (filter) 110 integrates the error signal. A quantizer 112 compares the integrated error signal to a threshold, and generates the digital output 104. In the example of FIG. 1A, the quantizer 112 is a single bit comparator generating a binary output. An analog switch 114 receives the digital output 104 and generates the feedback signal 106. In the example of FIG. 1A, the analog switch 114 selects one of two values (+V or −V) as the feedback signal, depending on the value of output 104.

Sigma-delta modulators may have multiple stages (orders), and may generate a multi-level output (the circuit in FIG. 1A is a single-order, single-level SDM). FIG. 1B illustrates a simplified single-order, multi-level SDM 120. SDM 120 receives an input signal 122, generates an output signal 124, and generates a feedback signal 126. A summing junction 128 combines the input signal 122 and the feedback signal 126 to form an error signal. An integrator (filter) 130 integrates the error signal. A quantizer (flash analog-to-digital converter (ADC)) 132 generates a digital output, depending on the magnitude of the integrated error signal. An analog switch 134 receives the output of the ADC and generates the feedback signal 126. In the example of FIG. 1B, the analog switch 134 selects one of three reference voltages (−V, 0, +V) as the feedback signal 126, depending on the output 124 of the flash ADC 132. Assume, for example, that the flash ADC 132 has two thresholds (one at +Vt and one at −Vt), and two output signals. A first output signal is "one" when the input is greater than +Vt, and the second output signal is "one" when the input is greater than −Vt. The output of the analog switch 134 is then +V when the first output signal is "one" (error signal>Vt); the output of the analog switch 134 is 0 when the first output signal is "zero" and second output signal is "one" (−Vt<error signal<Vt); and the output of the analog switch is −V when the second output signal is "zero" (error signal<−Vt).

In SDM 120 in FIG. 1B, the input signal to the ADC 132 is an integrated error signal, which on average is zero, and in general may be scaled to be a very small signal to maintain linearity or several other reasons. In the example discussed above, the ADC 132 has two levels (thresholds), but in general, there may be a need for many more than two levels. For low ADC input signals, high sampling frequencies, and many levels, the ADC 132 may be difficult to implement. Accordingly, there is a need for improved designs.

DETAILED DESCRIPTION

Figure 2:
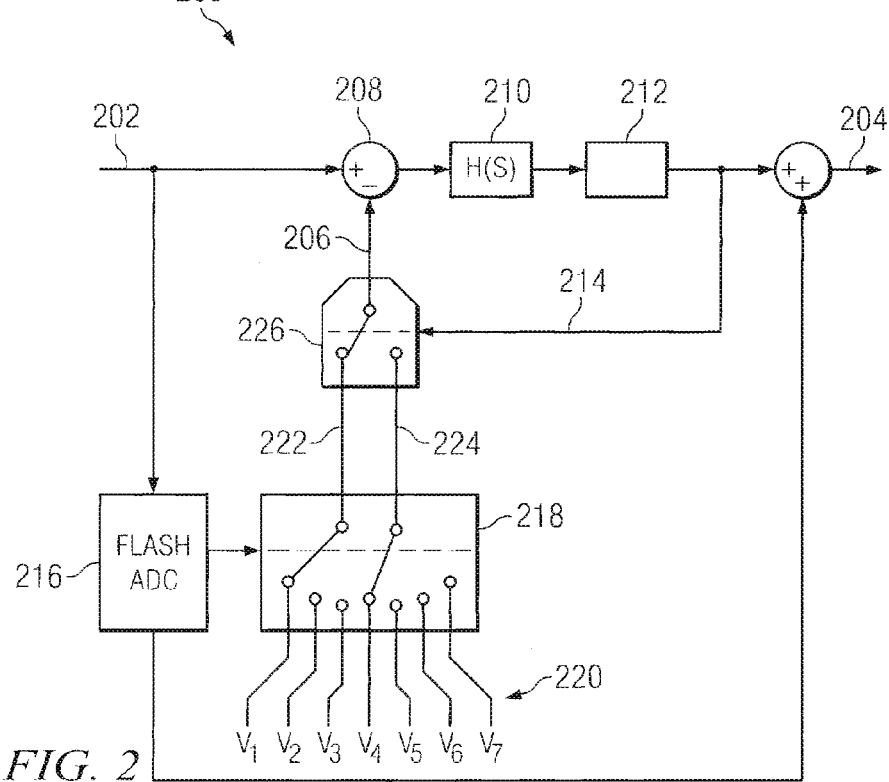
FIG. 2 is a block diagram illustrating an example embodiment of an improved single-order, multi-level, Sigma-Delta modulator.
Figure 3:
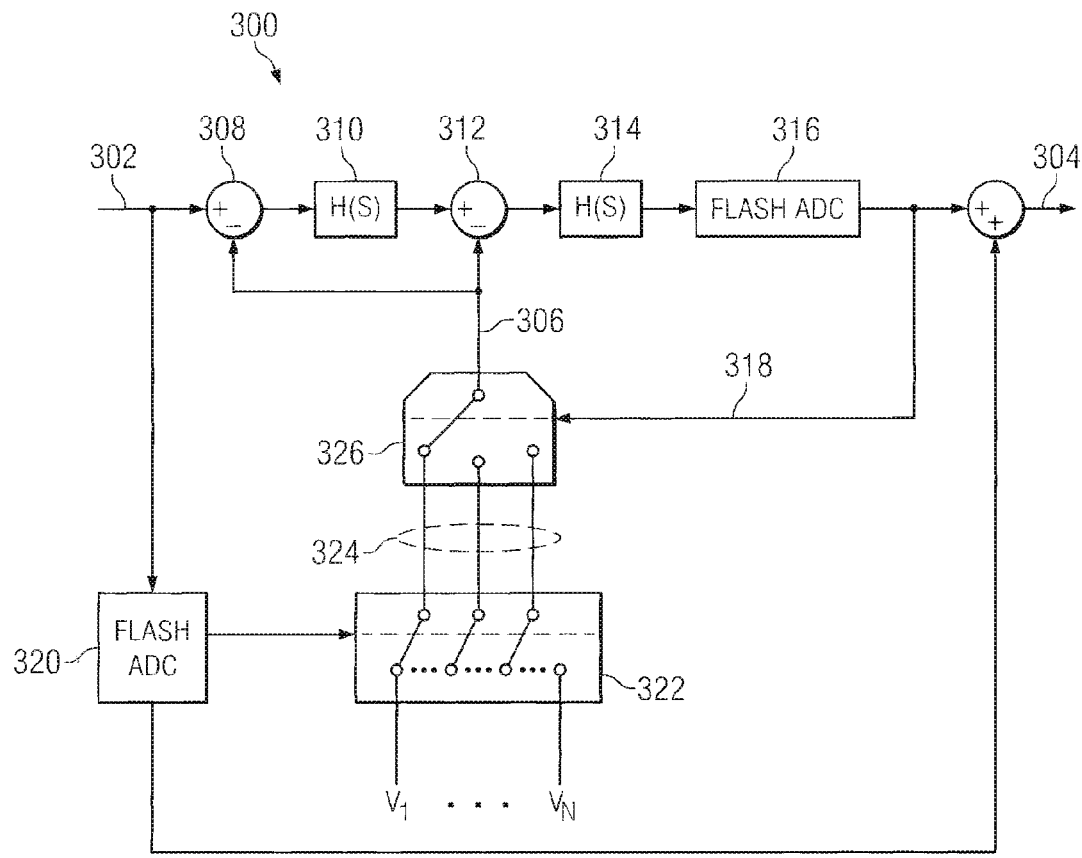
FIG. 3 is a block diagram illustrating an example embodiment of a second-order, multi-level Sigma-Delta modulator.

FIG. 2 illustrates an example embodiment of an improved single-order, multi-level, Sigma-Delta modulator 200. A single-order modulator with a binary quantizer is illustrated to simplify the introductory description, but the general concept may be extended to higher orders and multi-level quantizers, as illustrated in the example of FIG. 3. SDM 200 receives an input signal 202, generates a digital output signal 204, and generates a feedback signal 206. A summing junction 208 combines the input signal 202 and the feedback signal 206 to generate an error signal. An integrator (filter) 210 integrates the error signal. A quantizer 212 compares the integrated error signal to a threshold and generates a digital output 214.

Figure 1A:
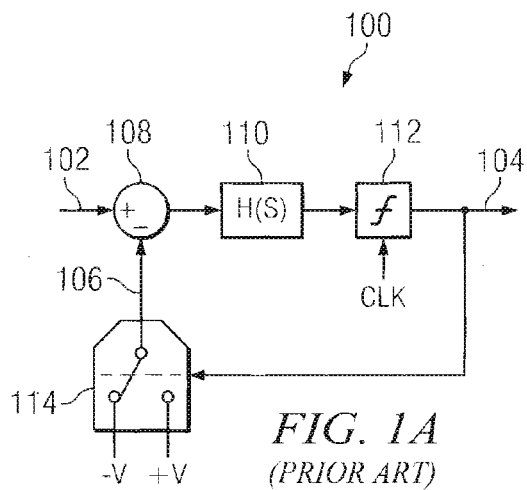
FIG. 1A is a block diagram illustrating an example prior art single-order, single-level, Sigma-Delta modulator.
Figure 1B:
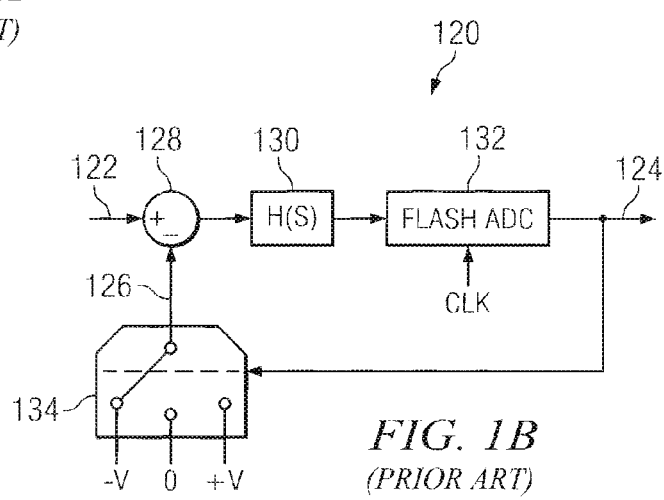
FIG. 1B is a block diagram illustrating an example prior art single-order, multi-level, Sigma-Delta modulator.

In contrast to the prior art circuits of FIGS. 1A and 1B, modulator 200 in FIG. 2 has a multi-level flash ADC 216 that receives the input signal 202, and controls a first analog switch 218. The first analog switch 218 selects from a plurality of first reference voltages 220, to generate a plurality of second reference voltages (222, 224), based on the digital output of the ADC 216. A second analog switch 226 selects one of the plurality of second reference voltages as the feedback signal 206, based on the digital output 214 of the quantizer 212. In the example of FIG. 2, quantizer 212 is a single bit comparator with a binary output, and the second analog switch selects one of two second reference voltages as the feedback signal. However, quantizer 212 could alternatively be a multi-level quantizer as discussed in conjunction with FIG. 3. If quantizer 212 is multi-level, then the first analog switch 218 generates more than two second reference voltages, as illustrated in FIG. 3.

Assume, for purposes of illustration, that the input signal 202 has a numerical range of −1.0 to 1.0, and that the flash ADC 216 has four thresholds (½, ⅙, −⅙, −½), and four outputs (F1, F2, F3, F4). Assume further that the seven first reference voltages 220 (V1-V7) are as follows: −1, −⅔, −⅓, 0, +⅓, +⅔, +1. Table 1 below is an example of the second reference voltages 222 and 224, as selected from the first reference voltages 220 by the first analog switch 218.

TABLE 1

| Input voltage 202 | F1 | F2 | F3 | F4 | 222 | 224 |
|---|---|---|---|---|---|---|
| >½ | 1 | 1 | 1 | 1 | +⅓ | +1 |
| >⅙ | 0 | 1 | 1 | 1 | 0 | +⅔ |
| >−⅙ | 0 | 0 | 1 | 1 | −⅓ | +⅓ |
| >−½ | 0 | 0 | 0 | 1 | −⅔ | 0 |
| <−½ | 0 | 0 | 0 | 0 | −1 | −⅓ |

Note, in the example of Table 1, the second reference voltages 222 and 224 are always symmetrical around a midpoint between ADC threshold voltages, and the difference between the two second reference voltages is a constant (⅔). For example, when the input voltage 202 is between the ADC thresholds −⅙ and +⅙, the second reference voltages are zero (midpoint between thresholds) minus ⅓ and zero plus ⅓.

In Table 1, when the input voltage 202 causes one of the digital outputs of the ADC 216 to switch states, both of the second reference voltages 222 and 224 switch levels, and a transient is introduced in the error signal, and at the output of the integrator (filter) 210, and in the resulting digital output signal 204. The effect of each transient can be reduced by increasing the number of levels in the ADC 216, and/or by implementing a multi-level quantizer 212, and/or by implementing a multi-order modulator. However, the effect of each transient can also be reduced by simply adjusting the second reference voltages 222 and 224 so that only one of the second reference voltages changes when the output of the ADC switches states. Table 2 below illustrates a modification of the selection of the second reference voltages 222 and 224 by the first analog switch 218.

TABLE 2

| Input voltage 202 | F1 | F2 | F3 | F4 | 222 | 224 |
|---|---|---|---|---|---|---|
| >½ | 1 | 1 | 1 | 1 | −⅓ | +1 |
| >⅙ | 0 | 1 | 1 | 1 | −⅓ | +⅔ |
| >−⅙ | 0 | 0 | 1 | 1 | −⅓ | +⅓ |
| >−½ | 0 | 0 | 0 | 1 | −⅔ | +⅓ |
| <−½ | 0 | 0 | 0 | 0 | −1 | +⅓ |

Assume that the input voltage 202 is between −⅙ and +⅙ and is increasing. In the example of Table 2, when the input voltage 202 exceeds +⅙, reference voltage 224 changes, but reference voltage 222 remains at −⅓, and when the input voltage 202 exceeds +½, reference voltage 224 changes but reference voltage 222 remains at −⅓. Similarly, when the input voltage 202 is decreasing, only one second reference voltage changes each time the output of the ADC switches states. Changing only one of the second reference voltages 222 and 224 reduces the transient effects when the ADC output switches states. In Table 2, the difference between signal 222 and signal 224 is not constant. The difference between signal 222 and signal 224 increases with increasing input signal magnitude (the peak-to-peak feedback signal is ⅔ for input signals between −⅙ and +⅙, 1.0 for signals between −½ and −⅙ or between +⅙ and +½, and ⁴⁄₃ for signals less than −½ or greater than +½).

In general, a multi-level modulator as in FIG. 1B has better performance than a single-level modulator as in FIG. 1A. The example modulator 200 of FIG. 2 has better performance than a single-level modulator as in FIG. 1A, but with an ADC that is easier to implement than a multi-level modulator with an ADC inside the modulator as in FIG. 1B. The input signal to the ADC 216 in the modulator of FIG. 2 has the full range of the input signal, whereas the input signal to the ADC 132 in FIG. 1B has the very small range of the integrated error signal. Accordingly, an ADC at the input of a modulator (as in the example of FIG. 2) is easier to implement than an ADC inside a modulator (as in the example of FIG. 1B). In addition, in the example circuit of FIG. 2, the configuration of the first analog switch 218 is particularly suitable for implementing non-uniform scaling (non-uniform reference voltage levels), which may be useful in systems that may receive occasional large signal amplitudes.

FIG. 3 illustrates a multi-order, multi-level modulator, with a flash ADC receiving a modulator input signal as in FIG. 2, and first and second analog switches generating an error signal as in FIG. 2. In FIG. 3, modulator 300 receives an input signal 302, generates a digital output signal 304, and a feedback signal 306. A first summing junction 308 subtracts the feedback signal from the input signal to generate a first error signal. A first integrator (filter) integrates the first error signal. A second summing junction 312 subtracts the feedback signal from the filtered first error signal to generate a second error signal. A second integrator (filter) 314 integrates the second error signal. A multi-bit ADC 316 receives the second error signal and generates a digital signal 318. A flash ADC 320 receives the input signal 302 and generates a digital signal. A first analog switch 322 receives the digital output from ADC 320 and generates a plurality of reference voltages 324, depending on the digital output from ADC 320. A second analog switch 326 generates the feedback signal 306, selecting one of the references voltages 324 as the feedback signal, depending on the digital output 318 of ADC 316.

Figure 4:
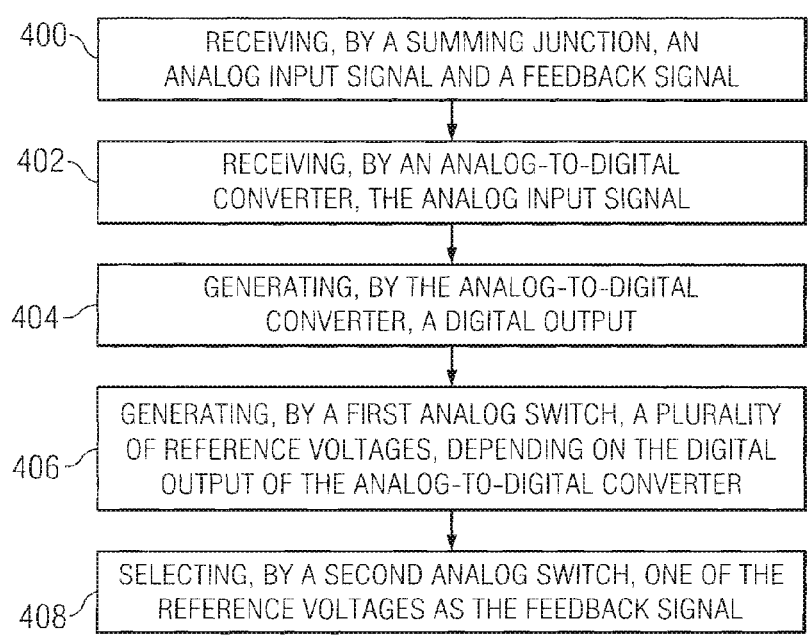
FIG. 4 is a flow chart of an example embodiment of a method of generating a feedback signal in a modulator.

FIG. 4 illustrates a method for generating a feedback signal in a modulator. Note that no order is implied by the arrangement of steps, and that some steps may occur simultaneously. At step 400, a summing junction receives an analog input signal and a feedback signal. At step 402, an analog-to-digital converter receives the analog input signal. At step 404, the analog-to-digital converter generates a digital output. At step 406, a first analog switch generates a plurality of reference voltages, depending on the digital output of the analog-to-digital converter. At step 408, a second analog switch selects one of the reference voltages as the feedback signal.

What is claimed is:

1. A modulator, comprising:
a summing junction configured to receive a modulator input signal and to receive a feedback signal, and to generate an error signal;
an analog-to-digital converter configured to receive the modulator input signal, and to generate a digital output signal;
a first analog switch configured to receive the digital output signal from the analog-to-digital converter, to select among five or more first reference voltages received at a same time by the first analog switch, and to generate a plurality of second reference voltages;
a second analog switch configured to generate the feedback signal, wherein the feedback signal is selected from one of the second reference voltages, depending on the output of the quantizer;
a filter configured to receive the error signal and to generate a filtered error signal;
a quantizer configured to receive the filtered error signal and to generate a quantizer output; and
wherein the quantizer is a multi-level analog-to-digital converter.

2. The modulator of claim 1, wherein the first analog switch is configured to generate more two reference voltages.

3. The modulator of claim 1, wherein the analog-to-digital converter is a flash analog-to-digital converter.

4. The modulator of claim 1, wherein if the analog-to-digital converter switches states, each first reference voltage changes.

5. The modulator of claim 1, wherein if the analog-to-converter switches states, at least one reference voltage does not change.

6. The modulator of claim 1, wherein the modulator has a single order.

7. The modulator of claim 1, wherein the modulator has a plurality of orders.

8. A modulator, comprising:
a summing junction, configured to receive a modulator input signal and to receive a feedback signal, and to generate an error signal;
a filter, configured to receive the error signal and to generate a filtered error signal;

a quantizer, configured to receive the filtered error signal and to generate a digital output;

a first analog switch, configured to receive the digital output, the first analog switch configured to select among five or more first reference voltages received at a same time, and further configured to generate a plurality of second reference voltages, depending on the magnitude of the modulator input signal; and, a second analog switch, configured to select one of the second reference voltages as the feedback signal, depending on the digital output of the quantizer, wherein the quantizer is a multi-level analog-to-digital converter.

9. The modulator of claim 8, where the first analog switch is configured to generate two second reference voltages and wherein the difference between the two second reference voltages is constant.

10. The modulator of claim 8, where the first analog switch is configured to generate two second reference voltages and the difference between two second reference voltages is variable, depending on the magnitude of the modulator input signal.

11. The modulator of claim 8, wherein the quantizer is a multi-level analog-to-digital converter.

12. The modulator of claim 8, wherein the quantizer is an analog-to-digital converter with at least two thresholds.

13. A modulator, comprising:

a summing junction configured to receive a modulator input signal and to receive a feedback signal, and to generate an error signal;

an analog-to-digital converter configured to receive the modulator input signal, and to generate a digital output signal;

a first analog switch configured to receive the digital output signal from the analog-to-digital converter, to select among five or more first reference voltages received at a same time by the first analog switch, and to generate a plurality of second reference voltages;

a second analog switch configured to generate the feedback signal, wherein the feedback signal is selected from one of the second reference voltages, depending on the output of the quantizer;

a filter configured to receive the error signal and to generate a filtered error signal;

a quantizer configured to receive the filtered error signal and to generate a quantizer output;

wherein the feedback signal is selected from one of the plurality of second reference voltages, depending on the output of the quantizer, wherein the quantizer is a multi-level analog-to-digital converter, wherein the analog-to-digital converter is a flash analog-to-digital converter, and wherein the modulator has a plurality of orders.

14. The modulator of claim 13, wherein the analog-to-converter switches states, at least one reference voltage does not change.

* * * * *